(12) United States Patent
Masuda et al.

(10) Patent No.: US 11,618,944 B2
(45) Date of Patent: Apr. 4, 2023

(54) SPUTTERING TARGET, MAGNETIC FILM, AND PERPENDICULAR MAGNETIC RECORDING MEDIUM

(71) Applicant: JX Nippon Mining & Metals Corporation, Tokyo (JP)

(72) Inventors: Manami Masuda, Ibaraki (JP); Masayoshi Shimizu, Ibaraki (JP); Yasuyuki Iwabuchi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 17/266,896

(22) PCT Filed: May 23, 2019

(86) PCT No.: PCT/JP2019/020556
§ 371 (c)(1),
(2) Date: Feb. 8, 2021

(87) PCT Pub. No.: WO2020/031460
PCT Pub. Date: Feb. 13, 2020

(65) Prior Publication Data
US 2021/0310114 A1 Oct. 7, 2021

(30) Foreign Application Priority Data
Aug. 9, 2018 (JP) .............................. JP2018-150675

(51) Int. Cl.
*H01J 37/34* (2006.01)
*C23C 14/34* (2006.01)
*C22C 19/07* (2006.01)
*G11B 5/706* (2006.01)
*H01F 1/10* (2006.01)
(Continued)

(52) U.S. Cl.
CPC .......... *C23C 14/3414* (2013.01); *C04B 35/01* (2013.01); *C22C 19/07* (2013.01);
(Continued)

(58) Field of Classification Search
None
See application file for complete search history.

(56) References Cited

U.S. PATENT DOCUMENTS

2001/0051287 A1* 12/2001 Kikitsu .................... G11B 5/00
2008/0084632 A1 4/2008 Shimizu
(Continued)

FOREIGN PATENT DOCUMENTS

| JP | 2001-256631 A | 9/2001 |
| JP | 2006-155861 A | 6/2006 |

(Continued)

OTHER PUBLICATIONS

Search Report in International Application No. PCT/JP2019/020556 dated Aug. 6, 2019 3 pages.
(Continued)

*Primary Examiner* — Jason Berman
(74) *Attorney, Agent, or Firm* — Marshall, Gerstein & Borun LLP

(57) ABSTRACT

Provided is a sputtering target, the sputtering target containing 0.05 at % or more of Bi and having a total content of metal oxides of from 10 vol % to 60 vol %, the balance containing at least Co and Pt.

6 Claims, 11 Drawing Sheets

(51) Int. Cl.
  *H01F 41/18* (2006.01)
  *G11B 5/65* (2006.01)
  *C04B 35/01* (2006.01)
  *C23C 14/08* (2006.01)
  *C23C 14/14* (2006.01)
  *C22C 32/00* (2006.01)
  *C22C 1/04* (2023.01)

(52) U.S. Cl.
  CPC .............. *C23C 14/08* (2013.01); *C23C 14/14* (2013.01); *G11B 5/658* (2021.05); *G11B 5/70605* (2013.01); *H01F 1/10* (2013.01); *H01F 41/18* (2013.01); *H01J 37/3426* (2013.01); *C04B 2235/405* (2013.01); *C04B 2235/408* (2013.01); *C22C 1/04* (2013.01); *C22C 32/00* (2013.01)

(56) References Cited

U.S. PATENT DOCUMENTS

2013/0134038 A1  5/2013  Sato et al.
2013/0213802 A1  8/2013  Sato et al.
2016/0276143 A1  9/2016  Goto et al.
2017/0206919 A1*  7/2017  Furuta ..................... G11B 5/82

FOREIGN PATENT DOCUMENTS

| JP | 2011-081873 A | 4/2011 |
| JP | 2011/174174 A | 9/2011 |
| JP | 2011-175725 A | 9/2011 |
| JP | 2011-208169 A | 10/2011 |
| JP | 4885333 B1 | 2/2012 |
| JP | 2012-117147 A | 6/2012 |
| JP | 2016-115379 A | 6/2016 |
| WO | WO-2012/086388 A1 | 6/2012 |
| WO | WO-2014/141737 A1 | 9/2014 |
| WO | WO-2015/064761 A1 | 5/2015 |

OTHER PUBLICATIONS

International Preliminary Report on Patentability in International Application No. PCT/JP2019/020556 dated Feb. 11, 2021, 6 pages.

* cited by examiner

Co-Pt-Bi-TiO$_2$-SiO$_2$

SPUTTERING TARGET, MAGNETIC FILM, AND PERPENDICULAR MAGNETIC RECORDING MEDIUM

FIELD OF THE INVENTION

This specification discloses arts relating to a sputtering target, a magnetic film, and a perpendicular magnetic recording medium.

BACKGROUND OF THE INVENTION

A magnetic recording medium such as a perpendicular magnetic recording medium that records magnetism in a direction perpendicular to a recording surface may be formed of a plurality of layers comprised of a recording layer including an upper recording layer and a lower recording layer, and other layers. Each of these layers is sputtered on a substrate using a sputtering target corresponding to each layer to form each film sequentially, in which a sputtering target having metal phases comprised of metals mainly based on Co and oxide phases containing a certain metal oxide may be used. Examples of such a sputtering target include those described in Patent Documents 1 to 12.

Here, predetermined layers such as the upper recording layer are required to form magnetic particles having desired saturation magnetization and vertical magnetic anisotropy with higher crystal orientation and good separation between magnetic particles.

Such layers are generally formed by a sputtering target obtained by adding a non-magnetic metal such as Pt, Cr and Ru, as described in, for example, Patent Literatures 1 to 10. This is because Pt, Cr or Ru can control the saturation magnetization and vertical magnetic anisotropy while maintaining good crystal orientation. As a result, it is possible to control both easy recordability and record retention property. Also, a recording layer capable of maintaining high-density recording bits is formed by simultaneously sputtering metal oxides such as $SiO_2$, $TiO_2$, and $B_2O_3$ and filling magnetic inter-particles with the sputtering metal oxides to form a so-called granular structure, thereby weakening exchange coupling between the magnetic particles.

CITATION LIST

Patent Literatures

[Patent Literature 1] Japanese Patent Application Publication No. 2011-208169 A
[Patent Literature 2] Japanese Patent Application Publication No. 2011-174174 A
[Patent Literature 3] Japanese Patent Application Publication No. 2011-175725 A
[Patent Literature 4] Japanese Patent Application Publication No. 2012-117147 A
[Patent Literature 5] Japanese Patent No. 4885333 B1
[Patent Literature 6] U.S. Patent Application Publication No. 2013/0134038 A1
[Patent Literature 7] WO 2012/086388 A1
[Patent Literature 8] U.S. Patent Application Publication No. 2013/0213802 A1
[Patent Literature 9] WO 2015/064761 A1
[Patent Literature 10] U.S. Patent Application Publication No. 2016/0276143 A1
[Patent Literature 11] Japanese Patent Application Publication No. 2011-208169 A
[Patent Literature 12] WO 2014/141737 A1

SUMMARY OF THE INVENTION

Technical Problem

However, the sputtering target obtained by adding the metal oxide such as $SiO_2$, $TiO_2$, and $B_2O_3$ to Pt, Cr or Ru as described above results in insufficient separateness of magnetic particles to further improve the recording density. Therefore, there would be still room for improving this type of sputtering target.

To solve the above problems, this disclosure proposes a sputtering target obtained by adding non-magnetic metals and oxides which contributes to control of saturation magnetization and magnetic anisotropy, and crystal orientation of magnetic particles and separateness of the magnetic particles; a magnetic film; and a perpendicular magnetic recording medium.

Solution to Problem

A sputtering target disclosed herein contains 0.05 at % or more of Bi, and has a total content of metal oxides of from 10 vol % to 60 vol %, the balance containing at least Co and Pt.

A magnetic film disclosed herein contains 0.05 at % or more of Bi, and has a total content of metal oxides of from 10 vol % to 60 vol %, the balance containing at least Co and Pt.

A perpendicular magnetic recording medium disclosed herein comprises the above magnetic film.

Advantageous Effects of Invention

According to the magnetic film and the perpendicular magnetic recording medium produced using the above sputtering target, it is possible to suppress particle growth of the magnetic particles and improve particle size dispersion of the magnetic particles and separateness between the magnetic particles, while maintaining crystal orientation of the magnetic particles.

DETAILED DESCRIPTION OF THE INVENTION

Figure 1:
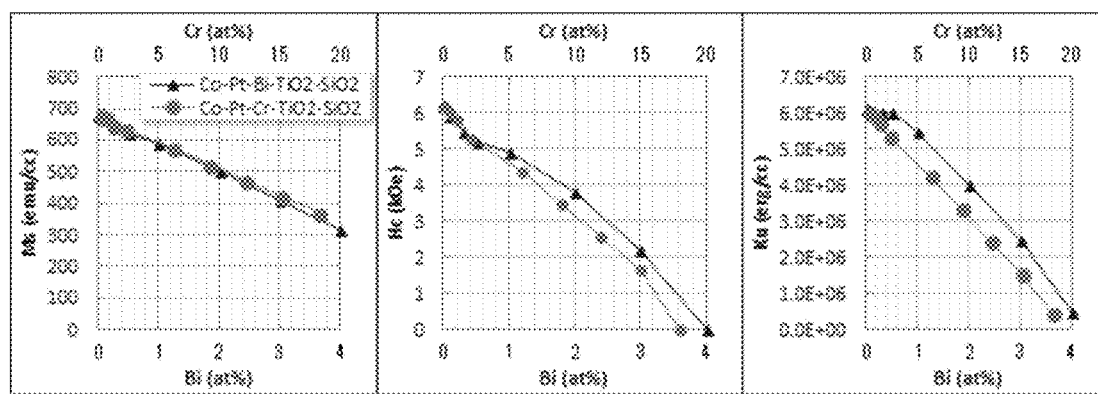
FIG. 1 is graphs showing changes in magnetic parameters of each sample formed by using sputtering targets of Examples and Comparative Examples with respect to amounts of Bi and Cr added.

Hereinafter, embodiments of the sputtering target, magnetic film and perpendicular magnetic recording medium as described above will be described in detail.

A sputtering target according to an embodiment contains 0.05 at % or more of Bi, and has a total content of metal oxides of from 10 vol % to 60 vol %, the balance containing at least Co and Pt. The sputtering using such a sputtering target containing Bi can provide improved separation of magnetic particles while maintaining crystal orientation.

Composition of Sputtering Target

Metal components of the sputtering target mainly contain Co and Pt, and it is important to contain Bi in addition to those components. By containing Bi, the growth of magnetic particles can be suppressed. This can allow a recording layer having smaller magnetic particles to be easily produced. Further, even if the film is formed at a higher substrate temperature in order to improve the crystallinity, the size of the magnetic particles is not increased, and both the smaller particle diameter and the crystallinity can be achieved. Furthermore, it is possible not only to easily segregate the metal oxide at grain boundaries, but also to form a film with less dispersion of a grain boundary width. This can allow finer magnetic particles having uniform particle diameter dispersion to be dispersed via oxide grain boundaries having a uniform width.

This would be because melting points of Bi and Bi oxide itself are lower, as well as the Bi oxide can be bonded to other main oxides to lower the melting point, and Bi and Co are difficult to form an alloy, while they have better wettability between Co and Bi oxide. In general, it is believed that, as a cause of an increase in particle diameter dispersion, the metal oxide having a higher melting point first solidifies to prevent the growth of magnetic particles based on Co. However, it can be expected that, by lowering the melting point of the metal oxide, the metal oxide easily moves and the growth of the particles is not hindered, so that the dispersion of the particle size can be reduced. Further, it can be expected that the better wettability between Bi oxide and Co suppress rounded magnetic particles surrounded by the oxide, resulting in a film with an oxide having a uniform width formed around polygonal magnetic particles. In addition, it is believed that Bi and Co have a property of being difficult to form an alloy, thereby preventing Bi from being unnecessarily diffused in the magnetic particles, and Co from being oxidized to be diffused in oxide phases at grain boundaries, even if the magnetic particles and the Bi oxide are brought into contact with each other. Therefore, it is believed that a composition distribution in the magnetic particles mainly based on CoPt becomes uniform.

Thus, it can be expected that the alloy composition of each magnetic particle becomes uniform to decrease the dispersion of magnetic characteristics. Further, it is believed that the expected magnetic anisotropy can be obtained from a CoPt ratio. The above matters can be considered, but they are not limited to such theories.

The Bi content is 0.05 at % or more in Bi equivalent. Bi may be contained as a metal component and/or an oxide component, but when it is contained as both the metal component and the oxide component, the above content means the sum of Bi elements in those components.

When the Bi content is less than 0.05 at %, the improvement of magnetic separateness between the magnetic particles is not sufficient. On the other hand, if the Bi content is too high, the hcp structure of the magnetic particles may be unstable. Therefore, the Bi content is preferably 0.5 at % or more, for example, from 0.5 at % to 10 at %.

For the above effect of adding Bi, it is preferable that a part or all of Bi is contained as a metal oxide.

The sputtering target contains at least Co and Pt as metal components. The Pt content can be arbitrarily selected to achieve the desired magnetic anisotropy. It is generally known that the highest magnetic anisotropy can be obtained by setting a molar ratio of Pt to a metal Co component to metal Co:Pt=3:1. However, if the ratio of metal Co:Pt is in a range of from 10:0 to 2:1, the sputtering target according to the embodiment can be achieved.

In addition to the above Co, Bi and Pt, the metal components of the sputtering target may further contain at least one selected from the group consisting of Au, Ag, B, Cu, Cr, Ge, Ir, Mn, Mo, Nb, Ni, Pd, Re, Rh, Ru, Ta, W, and V in the total amount of from 0.5 at % to 30 at %, as needed, in order to optimize the saturation magnetization, the magnetic anisotropy, and the wettability between the magnetic particles and the grain boundary oxide.

The sputtering target generally forms a granular structure in which metal oxides are dispersed in the above metals, and contains metal oxides. The total content of the metal oxides is from 10 vol % to 60 vol % in volume fraction. The total content of the metal oxides can be from 1 mol % to 20 mol %. If the amount of the metal oxide is too low, the separation of magnetic particles is insufficient, whereby a magnetic cluster size may increase. On the other hand, if the amount of the metal oxide is too high, the proportion of magnetic particles is lower, so that any sufficient saturation magnetization and magnetic anisotropy cannot be obtained, which may result in insufficient reproduction signal intensity and thermal stability.

The oxide volume fraction can be determined by calculation from density and molecular weight of each component contained in the sputtering target, but can also be determined from an area ratio of the oxide phases at any cut plane of the sputtering target. In this case, the volume ratio of the oxide phases in the sputtering target can be the area ratio at the cut surface.

Specific examples of the metal oxides include oxides of Co, Cr, Si, Ti, and B. Therefore, the sputtering target may contain an oxide of at least one element selected from the group consisting of Co, Cr, Si, Ti, and B. Examples of such metal oxides include $SiO_2$, $TiO_2$, and $B_2O_3$.

In particular, when a Ti oxide is contained, the separateness of magnetic particles is improved. Therefore, the sputtering target preferably contains the Ti oxide such as $TiO_2$.

Further, since the oxides of Si and B can amorphize the oxide layer and contribute to the formation of grain boundaries along the uniform width and the shape of the magnetic particles, the sputtering target preferably contains an oxide of either $SiO_2$ or $B_2O_3$.

Furthermore, Bi may be present in the target in the form of an oxide. That is, the metal oxide may contain Bi. The Bi oxide can be expected to form a composite oxide with other metal oxides to lower the melting point and improve the sinterability of the target. Moreover, it can be expected to facilitate segregation of the oxide to the particle diameter even in the state of the sputtered film.

(Method for Producing Sputtering Target)

The above sputtering target can be produced such as by a powder sintering method, and specific examples of the production method are described below.

First, as metal powder, Co powder, Bi powder, Pt powder, and optionally further powder of one or more selected from the group consisting of Au, Ag, B, Cu, Cr, Ge, Ir, Mn, Mo, Nb, Ni, Pd, Re, Rh, Ru, Ta, W and V, are prepared.

The metal powder may be powder of not only a single element but also an alloy. The particle diameter of the metal power is preferably in a range of from 1 μm to 150 μma, in terms of enabling homogeneous mixing to prevent segregation and coarse crystallization. If the particle diameter of the metal powder is more than 150 μm, oxide particles as described below may not be uniformly dispersed, and if it is less than 1 μm, the sputtering target may deviate from the desired composition due to the oxidation of the metal powder.

Further, as the oxide powder, for example, $TiO_2$ powder, $SiO_2$ powder, $Bi_2O_3$ and/or $B_2O_3$ powder are prepared. The oxide powder preferably has a particle diameter in a range of from 1 μm to 30 μm. This can lead to more uniform dispersion of the oxide particles in the metal phase when the oxide powder is mixed with the metal powder, and sintered under pressure. If the particle diameter of the oxide powder is more than 30 μm, coarse oxide particles may be formed after firing under pressure. On the other hand, if it is less than 1 μm, agglomeration of the oxide powders may occur.

The above metal powder and oxide powder are then weighed so as to provide a desired composition, and mixed and pulverized using a known method such as a ball mill. In this case, it is desirable to fill the inside of a container used for the mixing/pulverizing with an inert gas to suppress the oxidation of the raw material powder as much as possible. This can provide mixed powder in which the defined metal powder and oxide powder are uniformly mixed.

The mixed powder thus obtained is then sintered under pressure in a vacuum atmosphere or an inert gas atmosphere, and formed into a predetermined shape such as a disk shape. Herein, various pressure sintering methods can be employed such as a hot press sintering method, a hot hydrostatic sintering method, a plasma discharge sintering method and the like. Among them, the hot hydrostatic sintering method is effective in terms of improvement of density of a sintered body.

A retention temperature during the sintering is in a temperature range of from 600 to 1500° C., and more preferably from 700° C. to 1400° C. A time for maintaining the temperature in this range is preferably 1 hour or more.

A pressing pressure during the sintering is preferably 10 MPa or more, and more preferably 20 MPa or more.

This can allow the oxide particles to be more uniformly dispersed in the metal phase.

The sintered body obtained by the above pressure sintering can be subjected to cutting or other machining for forming a desired shape using a lathe or the like, to produce a sputtering target in the form of a disc or the like.

(Magnetic Film)

A magnetic film can be formed by performing sputtering with a sputtering apparatus, generally a magnetron sputtering apparatus, using the sputtering target as described above.

Such a magnetic film has substantially the same composition as that of the above sputtering target.

More particularly, the magnetic film is a so-called granular film which contains 0.05 at % or more, preferably 0.5 at % or more of Bi, and also contains a metal oxide(s) around a large number of magnetic particles based on Co and Pt, in an amount of from 10 vol % to 60 vol % in total. The total content of metal oxides in the magnetic film may be from 1 mol % to 20 mol %. The amount of Bi added can be adjusted to obtain a desired value. An increase in the amount of Bi added decreases the saturation magnetization, magnetic anisotropy, coercive force, which are design parameters of a recording layer, and these parameters also depend on amounts of other nonmagnetic metals and oxides. Therefore, it is difficult to generally specify the maximum amount of Bi added. However, when about 10 at % of Bi is added, the saturation magnetization and magnetic anisotropy are decreased. Therefore, in this case, it would be difficult to play a role as a recording layer. Accordingly, the Bi content in the magnetic film can be from 0.5 at % to 10 at %, for example.

The metal oxide in the magnetic film may include an oxide of at least one element selected from the group consisting of Co, Cr, Si, Ti, and B. Among these, the metal oxide preferably includes oxides of Ti, Si, and B. The total content of the metal oxides is from 10 vol % to 60 vol %.

The magnetic film may further contain one or more selected from the group consisting of Au, Ag, B, Cu, Cr, Ge, Ir, Mn, Mo, Nb, Ni, Pd, Re, Rh, Ru, Ta, W, and V in the total amount of from 0.5 at % to 30 at %.

Such a magnetic film can be used for various applications. For example, the magnetic film can be suitably used as a recording layer, among underlying layers, intermediate layers and protective layers such as adhesive layers, soft magnetic layers, seed layers, and Ru layers on a substrate forming a perpendicular magnetic recording type magnetic recording medium (i.e., a perpendicular magnetic recording medium). In particular, when the recording layer includes a lower recording layer responsible for thermal stability and an upper recording layer responsible for ease of recording, it is preferable that the upper recording layer is the above magnetic film. This is because the upper recording layer is required to have a material capable of forming a film which can adjust the saturation magnetization and the magnetic anisotropy, have improved separation of magnetic particles, and have uniform crystal orientation, and the above magnetic film satisfies such requirements.

(Perpendicular Magnetic Recording Medium)

In contrast to the conventional horizontal magnetic recording method in which magnetism is recorded in the horizontal direction with respect to the recording surface, the perpendicular magnetic recording medium records magnetism in a direction perpendicular to the recording surface. Therefore, the perpendicular magnetic recording medium can allow for higher density recording, so that it is widely employed for hard disk drives and the like. Specifically, the perpendicular magnetic recording type magnetic recording medium is formed by sequentially laminating an underlying layer such as adhesion layers, soft magnetic layers, seed layers and Ru layers, an intermediate layer, a recording layer and a protective layer, and the like, onto a substrate such as, for example, aluminum and glass. Among these, the recording layer can be formed so as to include the upper recording layer and the lower recording layer. The sputtering target as described above is suitable for forming the recording layer, among the above layers.

EXAMPLES

Next, the sputtering targets according to present invention were experimentally produced and their performance was confirmed as described below. However, the description herein is merely for the purpose of illustration and is not intended to be limited thereto.

As Examples and Comparative Examples, sputtering targets of Co—Pt—Bi—TiO$_2$—SiO$_2$ and Co—Pt—Bi$_2$O$_3$—TiO$_2$—SiO$_2$ were produced, and as Comparative Examples, sputtering targets of Co—Pt—TiO$_2$—SiO$_2$ and Co—Pt—Cr—TiO$_2$—SiO$_2$ were produced. Table 1 shows the composition of each sputtering target.

cooled as it is in the chamber. The sintered body thus obtained was cut to obtain a sputtering target.

As a raw material, Bi metal powder was used in Examples 1 to 8 and Comparative Example 11, and Bi oxide powder was used in Examples 9 to 16 and Comparative Example 21, respectively. Further, Cr metal powder was used in Comparative Examples 2 to 10, and Cr oxide powder was used in Comparative Examples 12 to 20, respectively.

Cr—Ti (6 nm), Ni—W (5 nm), and Ru (20 nm) were deposited in this order onto a glass substrate by a magnetron sputtering apparatus (C-3010 from CANON ANELVA CORPORATION). For the resulting film, each sputtering target was sputtered at 300 W in an Ar atmosphere at 5.0 Pa to form each magnetic film having a thickness of 11 nm, and then form Ru (3 nm) as a protective film for preventing oxidation of the magnetic layer to form each layer.

TABLE 1

| | Composition (mol %) | Co (at %) | Pt (at %) | Cr (at %) | Bi (at %) | Ti (at %) | Si (at %) | O (at %) | Oxide Volume Fraction (vol. %) |
|---|---|---|---|---|---|---|---|---|---|
| Example 1 | 69.2Co—18.4Pt—0.06Bi—7.3TiO2—5SiO2 | 55.5 | 14.8 | 0.0 | 0.1 | 5.9 | 4.0 | 19.8 | 30 |
| Example 2 | 69.1Co—18.4Pt—0.1Bi—7.3TiO2—5SiO2 | 55.5 | 14.8 | 0.0 | 0.1 | 5.9 | 4.0 | 19.8 | 30 |
| Example 3 | 68.9Co—18.4Pt—0.4Bi—7.3TiO2—5SiO2 | 55.3 | 14.8 | 0.0 | 0.3 | 5.9 | 4.0 | 19.8 | 30 |
| Example 4 | 68.6Co—18.4Pt—0.6Bi—7.3TiO2—5SiO2 | 55.1 | 14.8 | 0.0 | 0.5 | 5.9 | 4.0 | 19.8 | 30 |
| Example 5 | 68Co—18.4Pt—1.2Bi—7.3TiO2—5SiO2 | 54.6 | 14.8 | 0.0 | 1.0 | 5.9 | 4.0 | 19.8 | 30 |
| Example 6 | 66.6Co—18.4Pt—2.5Bi—7.5TiO2—5.1SiO2 | 53.2 | 14.7 | 0.0 | 2.0 | 6.0 | 4.1 | 20.1 | 30 |
| Example 7 | 65.1Co—18.3Pt—3.8Bi—7.6TiO2—5.2SiO2 | 51.8 | 14.6 | 0.0 | 3.0 | 6.1 | 4.2 | 20.4 | 30 |
| Example 8 | 63.7Co—18.3Pt—5.1Bi—7.7TiO2—5.3SiO2 | 50.6 | 14.5 | 0.0 | 4.0 | 6.1 | 4.2 | 20.6 | 30 |
| Example 9 | 69.4Co—18.5Pt—0.03Bi2O3—7.2TiO2—4.9SiO2 | 55.8 | 14.8 | 0.0 | 0.1 | 5.8 | 4.0 | 19.5 | 30 |
| Example 10 | 69.4Co—18.5Pt—0.06Bi2O3—7.2TiO2—4.9SiO2 | 55.8 | 14.9 | 0.0 | 0.1 | 5.8 | 4.0 | 19.5 | 30 |
| Example 11 | 69.3Co—18.5Pt—0.2Bi2O3—7.1TiO2—4.9SiO2 | 55.7 | 14.9 | 0.0 | 0.3 | 5.7 | 3.9 | 19.5 | 30 |
| Example 12 | 69.3Co—18.5Pt—0.3Bi2O3—7.1TiO2—4.8SiO2 | 55.6 | 14.9 | 0.0 | 0.5 | 5.7 | 3.9 | 19.4 | 30 |
| Example 13 | 69.1Co—18.6Pt—0.6Bi2O3—6.9TiO2—4.8SiO2 | 55.4 | 14.9 | 0.0 | 1.0 | 5.6 | 3.8 | 19.3 | 30 |
| Example 14 | 68.7Co—18.7Pt—1.3Bi2O3—6.7TiO2—4.6SiO2 | 54.9 | 14.9 | 0.0 | 2.0 | 5.4 | 3.7 | 19.1 | 30 |
| Example 15 | 68.5Co—18.8Pt—1.9Bi2O3—6.4TiO2—4.4SiO2 | 54.5 | 15.0 | 0.0 | 3.0 | 5.1 | 3.5 | 18.8 | 30 |
| Example 16 | 68.1Co—19Pt—2.5Bi2O3—6.2TiO2—4.2SiO2 | 54.0 | 15.1 | 0.0 | 4.0 | 4.9 | 3.4 | 18.6 | 30 |
| Comparative Example 1 | 69.3Co—18.4Pt—7.3TiO2—5SiO2 | 55.6 | 14.8 | 0.0 | 0.0 | 5.9 | 4.0 | 19.8 | 30 |
| Comparative Example 2 | 69.1Co—18.4Pt—0.1Cr—7.3TiO2—5SiO2 | 55.5 | 14.8 | 0.1 | 0.0 | 5.9 | 4.0 | 19.8 | 30 |
| Comparative Example 3 | 68.6Co—18.4Pt—0.6Cr—7.3TiO2—5SiO2 | 55.1 | 14.8 | 0.5 | 0.0 | 5.9 | 4.0 | 19.8 | 30 |
| Comparative Example 4 | 68Co—18.4Pt—1.2Cr—7.3TiO2—5SiO2 | 54.6 | 14.8 | 1.0 | 0.0 | 5.9 | 4.0 | 19.8 | 30 |
| Comparative Example 5 | 66.8Co—18.4Pt—2.5Cr—7.3TiO2—5SiO2 | 53.6 | 14.8 | 2.0 | 0.0 | 5.9 | 4.0 | 19.8 | 30 |
| Comparative Example 6 | 61.3Co—18.3Pt—7.5Cr—7.6TiO2—5.2SiO2 | 48.8 | 14.6 | 6.0 | 0.0 | 6.1 | 4.2 | 20.4 | 30 |
| Comparative Example 7 | 57.3Co—18.2Pt—11.4Cr—7.8TiO2—5.3SiO2 | 45.4 | 14.5 | 9.0 | 0.0 | 6.2 | 4.2 | 20.8 | 30 |
| Comparative Example 8 | 53.1Co—18.2Pt—15.2Cr—8TiO2—5.5SiO2 | 41.8 | 14.3 | 12.0 | 0.0 | 6.3 | 4.3 | 21.2 | 30 |
| Comparative Example 9 | 49Co—18.1Pt—19.1Cr—8.2TiO2-5.6SiO2 | 38.4 | 14.2 | 15.0 | 0.0 | 6.4 | 4.4 | 21.6 | 30 |
| Comparative Example 10 | 44.9Co—18.1Pt—23Cr—8.3TiO2—5.7SiO2 | 35.1 | 14.1 | 18.0 | 0.0 | 6.5 | 4.4 | 21.9 | 30 |
| Comparative Example 11 | 69.2Co—18.4Pt—0.01Bi—7.3TiO2—5SiO2 | 55.6 | 14.8 | 0.0 | 0.01 | 5.9 | 4.0 | 19.8 | 30 |
| Comparative Example 12 | 69.3Co—18.4Pt—0.06Cr2O3—7.3TiO2—5SiO2 | 55.5 | 14.7 | 0.1 | 0.0 | 5.8 | 4.0 | 19.9 | 30 |
| Comparative Example 13 | 69.2Co—18.4Pt—0.3Cr2O3—7.2TiO2—4.9SiO2 | 55.1 | 14.6 | 0.5 | 0.0 | 5.7 | 3.9 | 20.2 | 30 |
| Comparative Example 14 | 69.2Co—18.3Pt—0.6Cr2O3—7TiO2—4.8SiO2 | 54.6 | 14.4 | 1.0 | 0.0 | 5.6 | 3.8 | 20.6 | 30 |
| Comparative Example 15 | 69.3Co—18.2Pt—1.3Cr2O3—6.7TiO2—4.6SiO2 | 53.6 | 14.0 | 2.0 | 0.0 | 5.2 | 3.5 | 21.6 | 30 |
| Comparative Example 16 | 68.8Co—17.7Pt—4.1Cr2O3—5.6TiO2—3.8SiO2 | 49.7 | 12.8 | 6.0 | 0.0 | 4.0 | 2.7 | 24.7 | 30 |
| Comparative Example 17 | 68.2Co—17.4Pt—6.6Cr2O3—4.6TiO2—3.2SiO2 | 46.8 | 12.0 | 9.0 | 0.0 | 3.2 | 2.2 | 26.9 | 30 |
| Comparative Example 18 | 67.4Co—17.2Pt—9.2Cr2O3—3.7TiO2—2.5SiO2 | 43.9 | 11.2 | 12.0 | 0.0 | 2.4 | 1.7 | 28.9 | 30 |
| Comparative Example 19 | 66.5Co—16.8Pt—12.2Cr2O3—2.7TiO2—1.8Si02 | 40.9 | 10.4 | 15.0 | 0.0 | 1.6 | 1.1 | 31.0 | 30 |
| Comparative Example 20 | 65.1Co—16.6Pt—15.4Cr2O3—1.7TiO2—1.2Si02 | 38.0 | 9.7 | 18.0 | 0.0 | 1.0 | 0.7 | 32.7 | 30 |
| Comparative Example 21 | 69.4Co—18.5Pt—0.01Bi2O3—7.2TiO2—4.9SiO2 | 55.8 | 14.8 | 0.0 | 0.01 | 5.8 | 4.0 | 19.5 | 30 |

The specific method for producing those sputtering targets will be described in detail. First, certain metal powder and metal oxide powder were weighed, sealed in a 10 liter ball mill pot together with zirconia balls as grinding media and mixed by rotating it for 24 hours. The mixed powder removed from the ball mill was filled into a carbon cylindrical mold having a diameter of 190 mm and sintered by hot pressing. The hot pressing conditions were a vacuum atmosphere, a heating rate of 300° C./hour, a retention temperature of 1000° C., and a retention time of 2 hours. A pressure of 30 MPa was applied from the start of heating to the end of retention. After the end of retention, it was naturally For each sample thus obtained, a saturation magnetization Ms, a coercive force Hc, and a magnetic anisotropy Ku were measured. In addition, measuring devices used for the measurement were a sample vibration type magnetometer (VSM) and a magnetic torque meter (TRQ) from TAMAGAWA CO., LTD.

Figure 2:
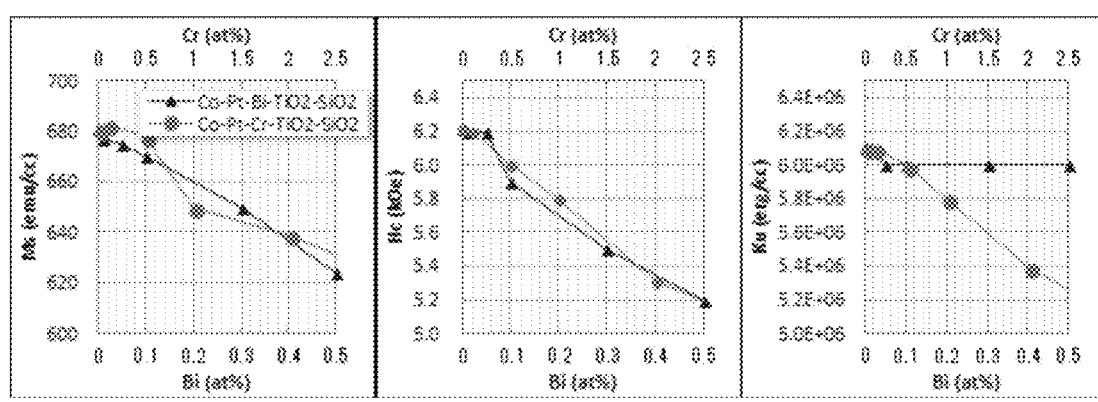
FIG. 2 is enlarged graphs each showing a part of a region on the horizontal axis of the graph of FIG. 1.

The results of these magnetic parameters arranged using the addition amounts of Bi and Cr as the horizontal axes are graphically shown in FIGS. 1 and 2. For the Bi and Cr on the horizontal axes, different coordinate axes were used so that Ms would be the same. When the Bi is added in an amount of 0.5 at % or less, the Ku is larger but the Hc has a little change in the case of the same Ms, as compared with the case where the Cr is added. This indicates that the addition of Bi does not deteriorate the crystallinity of the magnetic particles and improves the separability between the magnetic particles. Furthermore, when the Bi is added in an amount of 0.5 at % or more, the Hc is also slightly increased. This indicates that the improvement of the separability is saturated, but the good crystallinity is maintained.

Figure 3:
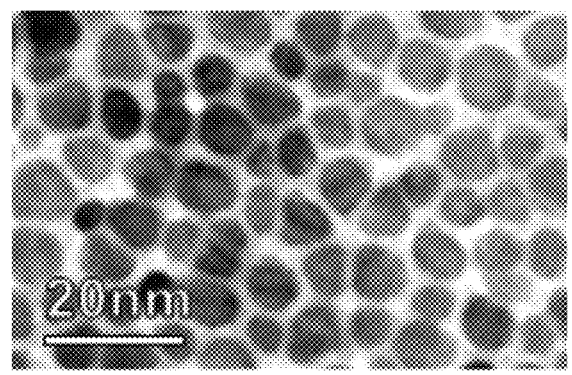
FIG. 3 is a TEM image of each sample formed by using a sputtering target of Example 5.
Figure 4:
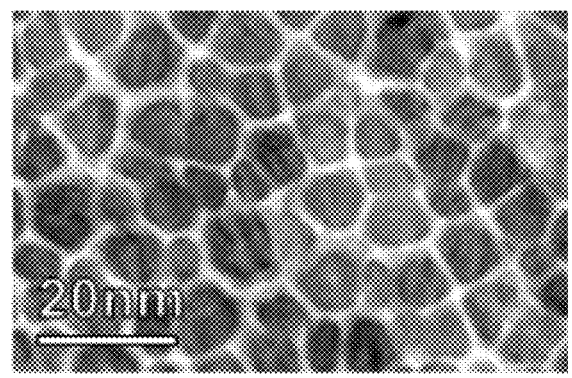
FIG. 4 is a TEM image of each sample formed by using a sputtering target of Comparative Example 6.
Figure 5:
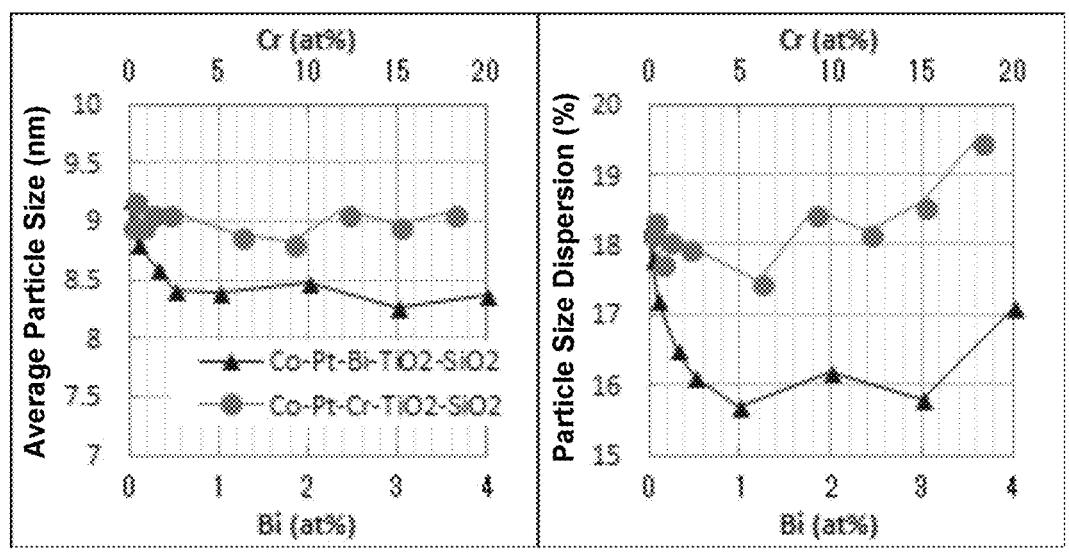
FIG. 5 is graphs showing changes in average particle size and particle size dispersion of each sample formed by using sputtering targets of Examples and Comparative Examples with respect to amounts of Bi and Cr added.
Figure 6:
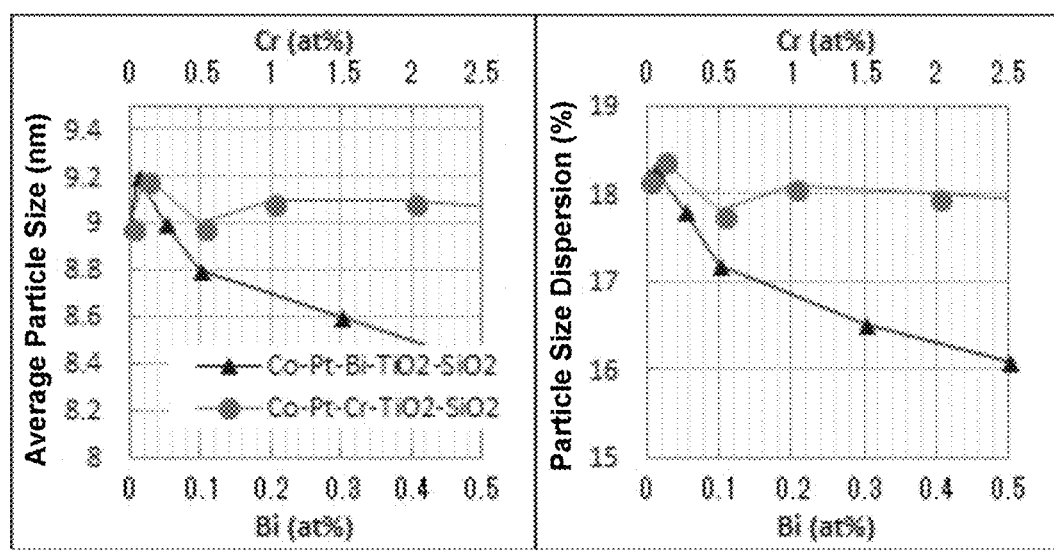
FIG. 6 is enlarged graphs each showing a part of a region on the horizontal axis of the graph of FIG. 5.
Figure 7:
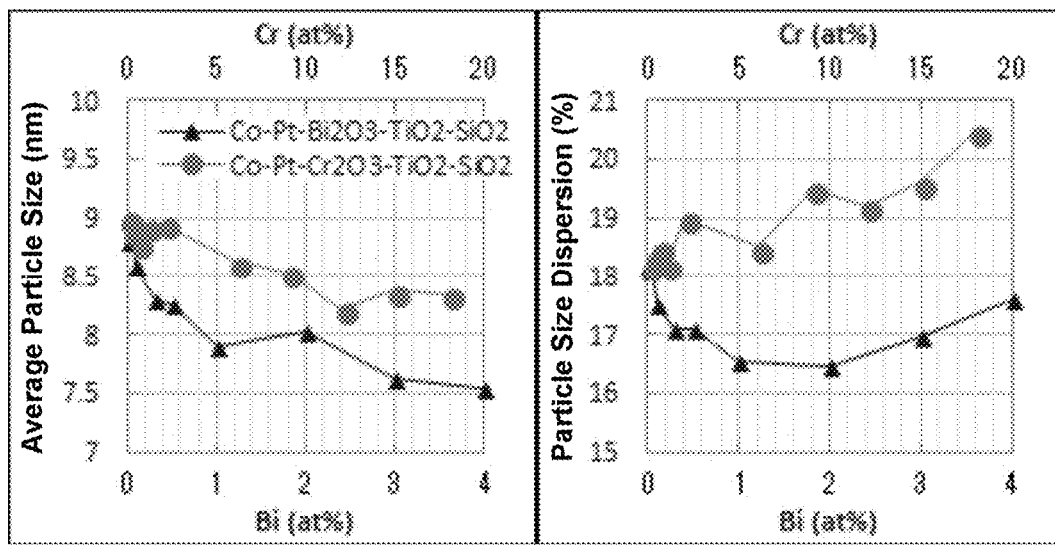
FIG. 7 is graphs showing changes in average particle size and particle size dispersion of each sample formed by using the sputtering targets of Examples and Comparative Examples with respect to amounts of Bi and Cr added.
Figure 8:
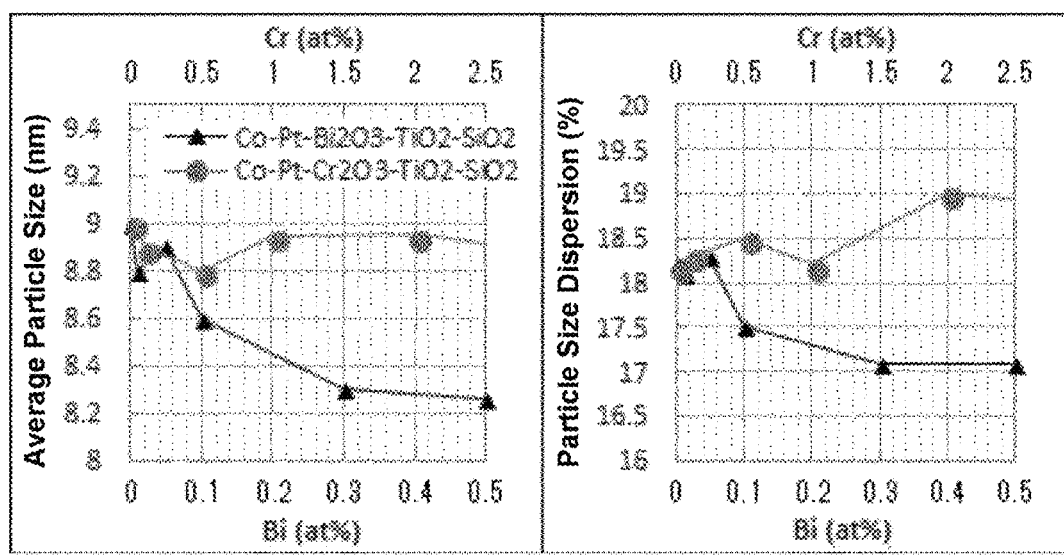
FIG. 8 is enlarged graphs each showing a part of a region on the horizontal axis of the graph of FIG. 7.
Figure 9:
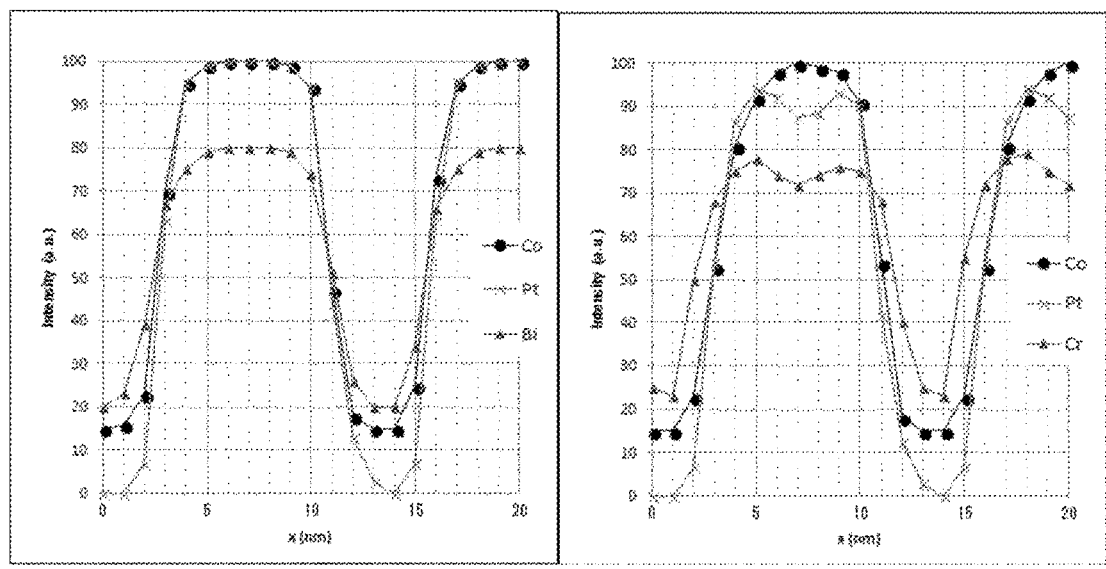
FIG. 9 is graphs each showing results of line analysis for Co, Pt, Bi, and Cr contents of each sample formed by using sputtering targets of Examples and Comparative Examples.

For Example 5 and Comparative Example 6, TEM images obtained by energy dispersive X-ray spectroscopy (TEM-EDX) using a transmission electron microscope from JEOL Ltd. are shown in FIGS. 3 and 4, and the average particle size and particle size dispersion of the magnetic particles obtained by image analysis arranged by the amounts of Bi and Cr added are also shown in FIGS. 5 to 8. Furthermore, the results of line analysis for each element of Co, Pt, Bi, and Cr using EDX are shown in FIG. 9. According to these, it is found that when the Bi is added, the particle size of the magnetic particles is smaller than that when the Cr is added, the distribution of the Bi in the magnetic particles is more uniform than that of Cr, and the composition dispersion is also smaller.

Figure 10:
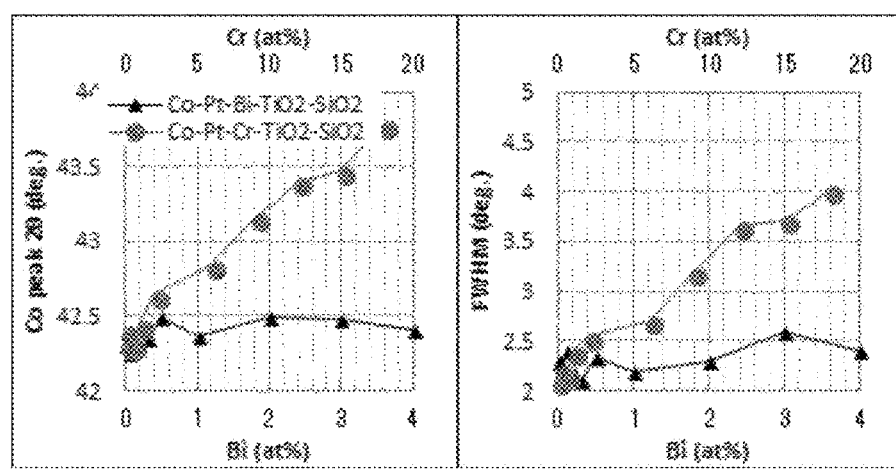
FIG. 10 is graphs each showing a peak intensity of an output derived from Co in a hcp structure for X-ray diffraction of each sample formed by using sputtering targets of Examples and Comparative Examples.
Figure 11:
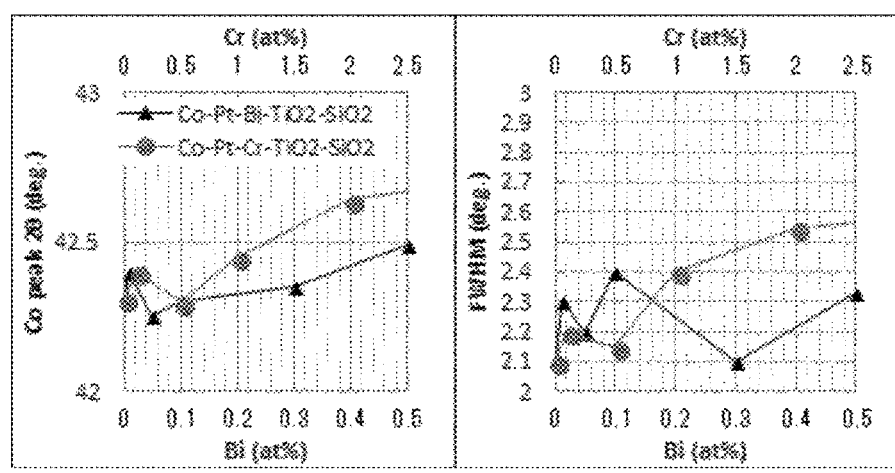
FIG. 11 is graphs each showing a half width of an output derived from Co in a hcp structure for X-ray diffraction of each sample formed by using sputtering targets of Examples and Comparative Examples.

The X-ray diffraction measurements were carried out for each of the above materials using an X-ray diffractometer (SmartLab) from Rigaku Corporation. By the θ/2θ measurement, the 2θ value of the (002) diffraction peak of the CoPt magnetic particles having the hcp structure was measured, the locking curve was measured with the 2θ value, and the half width was determined. The results are shown in FIGS. 10 and 11. It is found that when the Bi is added, the magnetic particles have improved crystallinity, because the 2θ value is smaller and the half width is smaller than those when the Cr is added.

In view of the foregoing, it is understood that according to the sputtering targets of Examples, the growth of magnetic particles in the magnetic film is suppressed, the metal oxide is easily segregated at the grain boundaries, so that a film having less dispersion of the grain boundary width can be formed. Further, it is found that finer magnetic particles having a uniform particle size dispersion can be dispersed through oxide grain boundaries having a uniform width. It is also found that the crystallinity of the magnetic particles is improved and the dispersion of the magnetic characteristics of the magnetic particles can be suppressed.

The invention claimed is:

1. A sputtering target, the sputtering target containing 0.05 at % or more of Bi and having a total content of metal oxides of from 10 vol % to 60 vol %, the balance containing at least Co and Pt, wherein the sputtering target does not contain Mn.

2. The sputtering target according to claim 1, wherein the sputtering target contains a part or all of Bi as a metal oxide.

3. The sputtering target according to claim 1, wherein the sputtering target contains 0.5 at % or more of Bi.

4. The sputtering target according to claim 1, wherein the metal oxide comprises an oxide of at least one element selected from the group consisting of Co, Cr, Si, Ti, and B.

5. The sputtering target according to claim 1, wherein the sputtering target further contains from 0.5 at % to 30 at % of at least one selected from the group consisting of Au, Ag, B, Cu, Cr, Ge, Ir, Mo, Nb, Ni, Pd, Re, Rh, Ru, Ta, W, and V.

6. The sputtering target according to claim 1, wherein the sputtering target contains 0.05 at % to 10 at % of Bi.

* * * * *